United States Patent
Schneider et al.

(10) Patent No.: US 7,359,271 B2
(45) Date of Patent: Apr. 15, 2008

(54) GATE INDUCED DRAIN LEAKAGE CURRENT REDUCTION BY VOLTAGE REGULATION OF MASTER WORDLINE

(75) Inventors: Helmut Schneider, Munich (DE); Harald Streif, Burlington, VT (US)

(73) Assignee: Infineon Technologies AG, Neubiberg (DE)

( * ) Notice: Subject to any disclaimer, the term of this patent is extended or adjusted under 35 U.S.C. 154(b) by 11 days.

(21) Appl. No.: 11/313,650

(22) Filed: Dec. 22, 2005

(65) Prior Publication Data

US 2007/0147153 A1    Jun. 28, 2007

(51) Int. Cl.
G11C 7/00         (2006.01)
(52) U.S. Cl. .............. 365/222; 365/229; 365/189.09; 365/189.11
(58) Field of Classification Search ............... 365/222
See application file for complete search history.

(56) References Cited

U.S. PATENT DOCUMENTS

| | | | | |
|---|---|---|---|---|
| 6,343,045 | B2* | 1/2002 | Shau | 365/227 |
| 6,894,917 | B2* | 5/2005 | Ting et al. | 365/149 |
| 2004/0017720 | A1* | 1/2004 | Mori et al. | 365/222 |
| 2004/0042305 | A1* | 3/2004 | Joo | 365/205 |
| 2006/0114735 | A1* | 6/2006 | Takahashi | 365/222 |
| 2007/0030738 | A1* | 2/2007 | Oh | 365/189.01 |
| 2007/0040581 | A1* | 2/2007 | Chen | 326/83 |
| 2007/0121406 | A1* | 5/2007 | Oh | 365/222 |

* cited by examiner

Primary Examiner—Huan Hoang
Assistant Examiner—Anthan T Tran
(74) Attorney, Agent, or Firm—Edell, Shapiro & Finnan LLC

(57) ABSTRACT

A semiconductor integrated circuit device and method for reducing gate induced leakage current associated with circuits of the semiconductor electrical device, such as a semiconductor integrated circuit memory device. During a standby mode, a voltage supplied to a plurality of circuits is reduced so as to reduce gate induced leakage (GIDL) current associated with said plurality of circuits. During time intervals while in the standby mode, the voltage supplied to a subset of said plurality of circuits is increased to a level necessary for a refresh function associated with said subset of said plurality of circuits and then it is reduced upon completion of said refresh function. In the example a semiconductor memory device, the circuits that are manipulated in this manner are wordline driver circuits. A cyclical self-refresh operation is provided to refresh the WLs associated with subsets of the wordline driver circuits to reduce the overall GIDL current associated with the plurality of wordline driver circuits.

12 Claims, 6 Drawing Sheets

GATE INDUCED DRAIN LEAKAGE CURRENT REDUCTION BY VOLTAGE REGULATION OF MASTER WORDLINE

BACKGROUND OF THE INVENTION

The present invention is directed to semiconductor devices, and more particularly to reducing current consumption of a semiconductor memory device.

Semiconductor memory devices, such as dynamic random access memory (DRAM) devices, are manufactured using semiconductor fabrication technologies that are designed to reduce the size of the overall fabricated device. With the advancement of semiconductor fabrication technologies to smaller feature sizes, the ratio of so-called "leakage current" to overall operating current increases significantly. Leakage current is produced by circuits in the semiconductor device when certain voltage conditions associated with the circuit are present. There is also a trend in which semiconductor devices are to be designed to have minimal standby power consumption for use in mobile battery-powered host devices in order to support longer battery-powered operations. Thus, a tension exists between designing the smallest possible semiconductor device but still maximizing the power consumption efficiency of the semiconductor device. Such is the case with semiconductor memory and other integrated circuit devices.

One leakage current mechanism that has been mostly neglected until recently is called the gate induced drain leakage (GIDL). For example, one circuit component that is the building block of digital logic functions, including data storage (memory) circuits is the so-called field effect transistor. There are millions of these transistors in many semiconductor integrated circuit devices, and each has a drain terminal, gate terminal and source terminal. When there is a relatively high gate to drain voltage difference, electron/hole pairs are generated in the overlap region of the gate and drain/source diffusion region of the transistor. A current, called the GIDL current, is established between the drain/source region and the gate. The GIDL current mainly depends on the thickness of the oxide layer in the transistor, which in turn greatly depends on the feature size of the semiconductor fabrication technology used. For example, in semiconductor fabrication technologies less than or equal to 70 nm, the oxide layer is extremely thin making the gate to drain voltage difference quite significant. Nevertheless, only recently has the feature size of semiconductor process technologies become so small that reducing the GIDL current has become a design issue.

In designing semiconductor devices, such as DRAMs, it is important to suppress or eliminate the GIDL current in order to produce a product is competitive for power consumption sensitive applications.

SUMMARY OF THE INVENTION

Briefly, a semiconductor integrated circuit device and method are provided for reducing gate induced leakage current associated with circuits of the semiconductor electrical device, such as a semiconductor integrated circuit memory device. During a standby mode, a voltage supplied to a plurality of circuits is reduced so as to reduce gate induced leakage (GIDL) current associated with said plurality of circuits. During time intervals while in the standby mode, the voltage supplied to a subset of said plurality of circuits is increased to a level necessary for a refresh function associated with said subset of said plurality of circuits and then it is reduced upon completion of said refresh function. In the example a semiconductor memory device, the circuits that are manipulated in this manner are wordline driver circuits. A cyclical self-refresh operation is provided to refresh the WLs associated with subsets of the wordline driver circuits to reduce the overall GIDL current associated with the plurality of wordline driver circuits.

DETAILED DESCRIPTION

Figure 1:
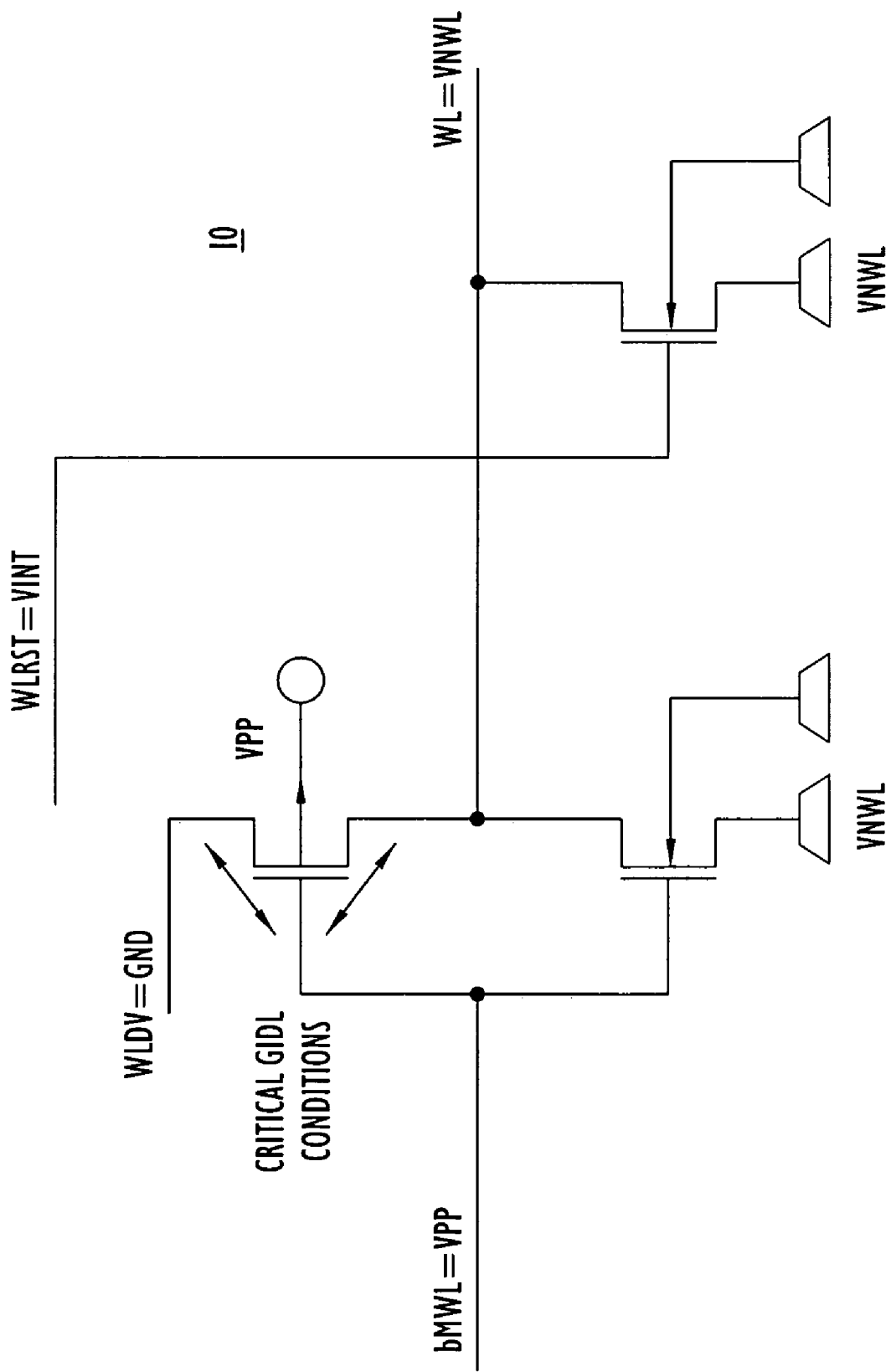
FIGS. 1 and 2 are reduced schematic diagrams of the main two circuits needed for a segmented wordline design of semiconductor integrated circuit device to which an embodiment of the present invention pertains.
Figure 2:
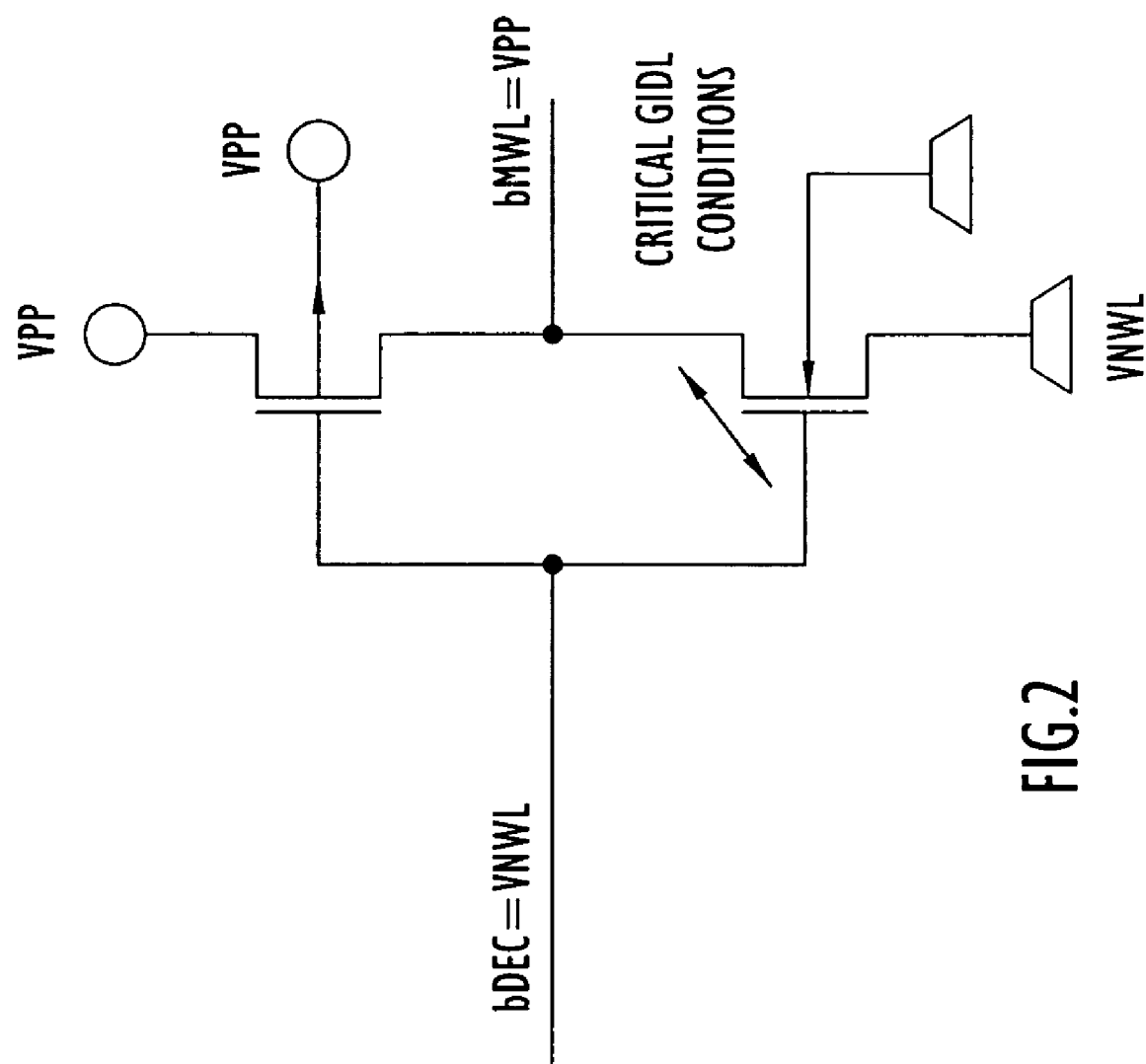

In a semiconductor memory device, such as a DRAM device, high gate to drain voltages are primarily found in the row path system where boosted voltages and negative voltages are used in the same circuitry. FIGS. 1 and 2 show examples of circuits commonly used in semiconductor memory devices, which circuits present GIDL current issues. FIG. 1 illustrates a master wordline (WL) driver circuit 10 and FIG. 2 illustrates a local WL driver circuit 20. These circuits are used to access rows of memory cells in a memory cell array block. Both of these circuits are instantiated, depending on the memory chip size, more than 10,000 times, for example, in a semiconductor integrated circuit memory device. The WL driver circuit is inactive when the line bMWL is coupled to a voltage $V_{PP}$, which is greater than $V_{DD}$ for the circuit. Thus, $V_{PP}$ is the boosted WL voltage level (>$V_{DD}$) and $V_{NWL}$ is the WL low level (usually less than 0 V). In these circuit arrangements, the maximum voltage difference is between $V_{PP}$ and $V_{NWL}$.

All of the illustrated GIDL conditions could be eliminated by lowering the master WL voltage (bMWL) from $V_{PP}$ (e.g., 2.6V) to an intermediate voltage level, $V_{DD}$ (e.g., 1.8V) during a standby mode (IDD2PS) and/or a self-refresh mode (IDD6) of the memory device. Lowering this critical voltage difference (gate to drain) during an idle or standby state of the memory device achieves significant (exponential) reduction in the GIDL current. For example, this voltage change resolves more than 95% of all critical GIDL conditions on the integrated circuit. As used hereinafter, $V_{PP}$ is the normal inactive voltage, also referred to as the first voltage (level), and $V_{DD}$ is the reduced voltage or second voltage (level).

In a memory device such as a DRAM device, all of the memory cells in the memory device need to be refreshed once during a so-called self-refresh period. Consequently, the WL driver circuits need to be switched back into a normal operating condition for the refresh operation or function if they have been at a reduced voltage during a standby state. Since the wire and gate load of every WL driver circuit is significant, the activation current needed to charge up all master WL driver circuits in a memory device to its full $V_{PP}$ level would over-compensate for any GIDL leakage reduction afforded by a reduction of all WL driver circuits. Similarly, all master WL circuits need to be charged up to full $V_{PP}$ level again before the memory device can resume its normal operation (exiting from self-refresh or stand-by).

Figure 3:
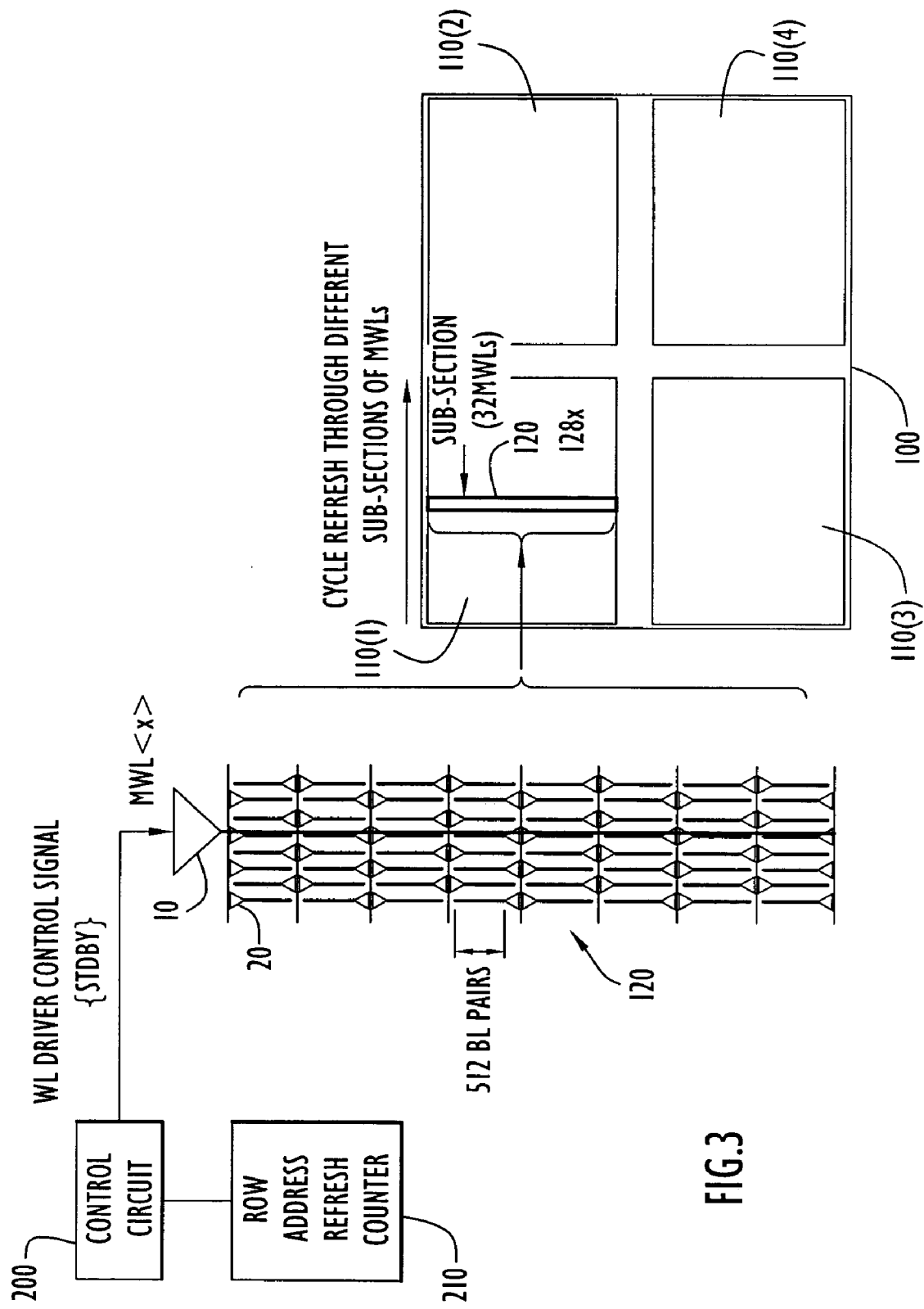
FIG. 3 is a block diagram of control circuitry for reducing the gate induced leakage current of wordline driver circuits in a semiconductor integrated circuit device according to an exemplary embodiment of the present invention.

Turning to FIG. 3, a system and method according to the present invention will be described with respect to an exemplary semiconductor device. The exemplary semiconductor device is a semiconductor integrated circuit memory device having a segmented-WL configuration. The memory array 100 of a semiconductor integrated circuit memory device includes multiple "blocks" 110, which in the example shown in FIG. 3, there are 4 blocks 110(1) to 110(4). Each block comprises a plurality of memory cells that are addressed by WLs. Within each block 110(1) to 110(4), there are segmented WL sub-sections 120 comprised of a number of master WLs, such as 32 master wordlines (MWLs). For each MWL sub-section 120, there is a master WL driver circuit 10 and then for each WL in the sub-section there is a local WL driver circuit 20. The driver circuits 10 and 20 may be of the type shown in FIGS. 1 and 2, respectively. Thus, in a given block 110(1) to 110(4) there are 128 sub-sections 120 of 32 master WLs for a total of 4096 master WLs in this example. Furthermore, associated with each local WL driver circuit 20 are 512 bitline pairs in the exemplary segmented-WL memory device shown in FIG. 3.

According to the present invention, a method and circuitry are provided to reduce self-refresh/standby current of the WL driver circuits by reducing critical voltage conditions on selected subsets (e.g., nets or sub-sections) of master WLs without significantly increasing power consumption for the discharge and charge-up action. This is achieved by cycling through the master WL sub-sections 120 in each block 110(1) so that during any given time interval (during the standby state), only a subset, e.g., a single sub-section 120, of all of the master WL driver circuits are switched to the voltage ($V_{PP}$) and refreshed. To reduce power consumption of the WL driver circuits during actual refresh periods, the number of master WL driver circuits being charged up to full $V_{PP}$ power and consecutively discharged again is kept to a minimum. In addition, sufficient time needs to be allocated for charge-up and discharge. The optimal number of master WL driver circuits to be included in a subset for this sequential or cyclical refresh operation depends on layout constraints and control logic overhead. In the example shown in FIG. 3, the optimal number is 32 master WLs (out of 4096), hence the size of a single sub-section 120. However, it should be understood the number of master WLs in a given subset can be more or less depending on the layout and control logic constraints. Nevertheless, in this example, maintaining only those 32 master WLs at charged $V_{PP}$ conditions, i.e., charged up for refresh, during the time needed to refresh 128 WLs reduces the average GIDL current to $\frac{1}{128}$ of what it would otherwise be if 128 WLs were active for refresh. It should be understood that inter-block redundancy schemes for failed memory cells may require WL activation outside of a particular block.

For purpose of controlling operation of the GIDL reduction method described herein, there is a control circuit 200 connected to a row address counter 210. The row address counter 210 is a circuit already included in most semiconductor memory circuits and provides a means for counting through row addresses for WLs in the memory array 100 during the cyclical refresh operation. The control circuit 200 is responsive to the output of the row address counter to supply WL driver control signals to appropriate ones of the subsets of master WLs in the array 100 in order to perform the cyclical refresh scheme that preserves significant GIDL current reduction. The control circuit 200 supplies a driver circuit control signal STDBY to switching circuitry associated with WL driver circuitry.

Figure 4:
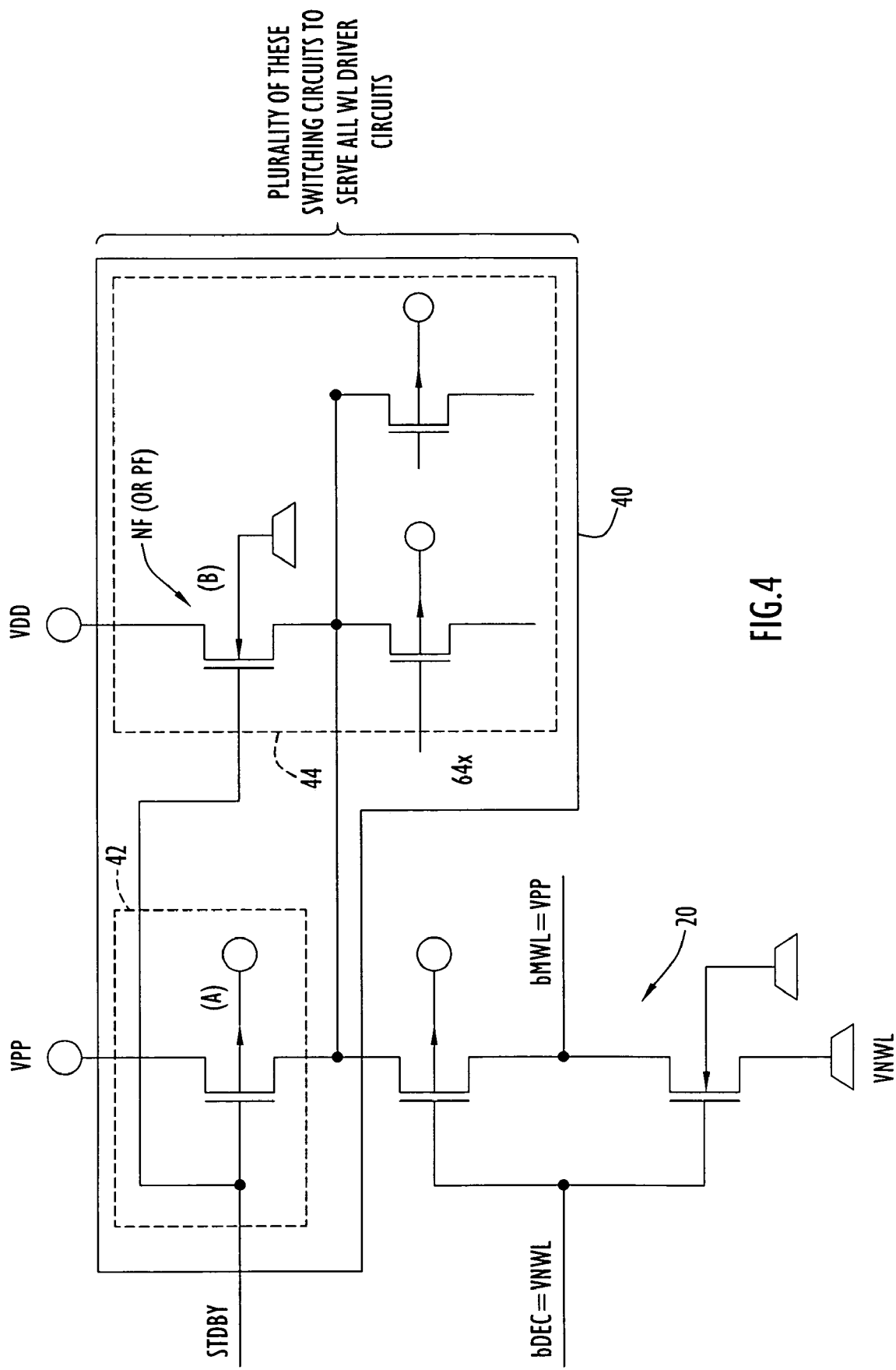
FIG. 4 is a schematic diagram of switching circuitry used for switching the voltage to the wordline driver circuits according to an exemplary embodiment of the present invention.

Turning now to FIG. 4, an exemplary embodiment of a switching circuit 40 associated with a WL driver circuit 20 is shown. There is a plurality of the switching circuits to serve the plurality WL driver circuits, but each switching circuit may serve groups of WL driver circuits as explained below. The switching circuit comprises a first transistor circuit 42 and a second transistor circuit 44 that cooperate to switch the driver circuit 20 between $V_{PP}$ and $V_{DD}$. When the control signal STDBY is at $V_{NWL}$, bDEC is at $V_{NWL}$ and bMWL is at $V_{PP}$. However, in order to reduce GIDL current of the driver circuit 20, the control signal STDBY is switched from $V_{NWL}$ to $V_{PP}$, which causes the voltage $V_{PP}$ on bMWL of the driver circuit 20 to discharge through the circuit 44 to the voltage $V_{DD}-V_T$ for an n-FET implementation or to $V_{DD}$ for a p-FET implementation. The circuits 42 and 44 can be shared for multiple driver circuits 20, e.g., 64 times. Thus, when placing driver circuits into reduced GIDL current state, the STDBY signal is kept at $V_{PP}$, and when the need arises to charge a driver circuit for a refresh operation, the STDBY signal is switched to $V_{NWL}$. This is how the control circuit 20 controls the state of WL driver circuits, together with input from the row address counter 210.

Figure 5:
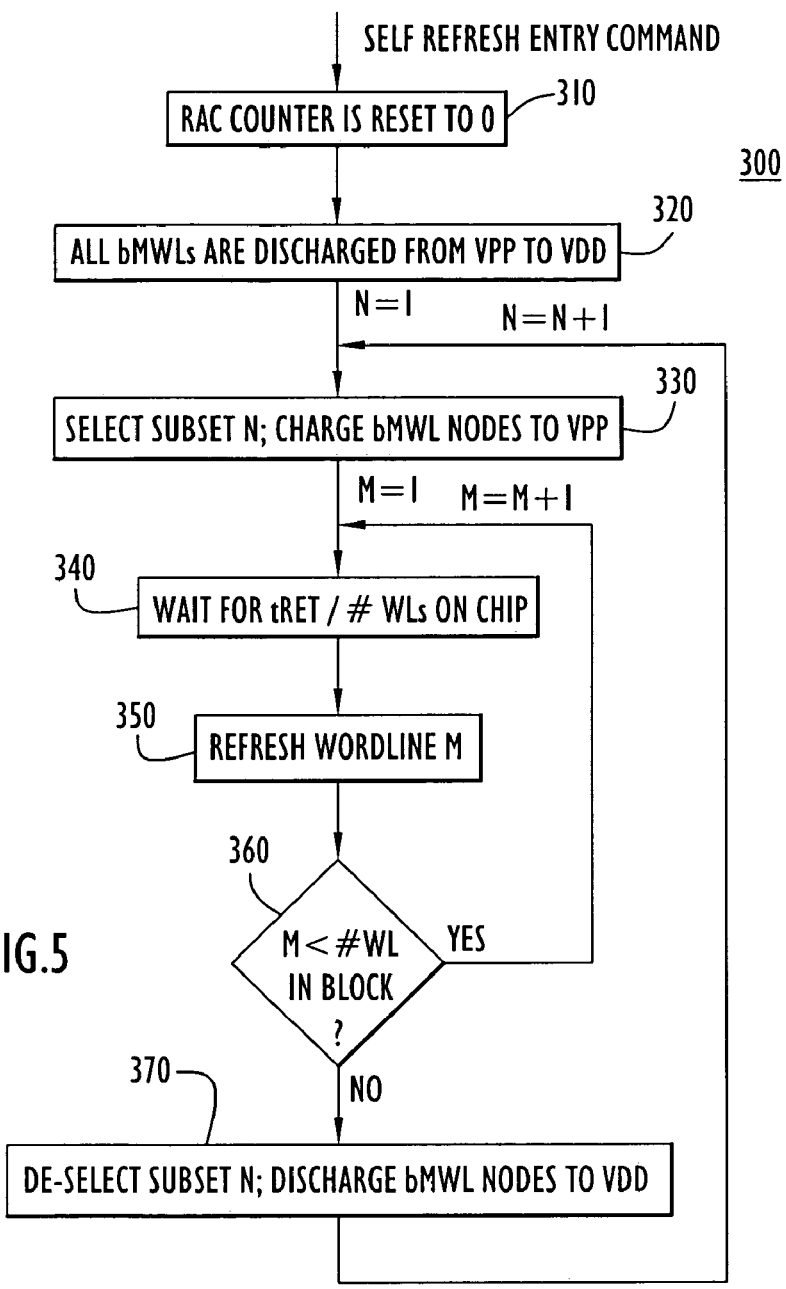
FIG. 5 is a flow chart showing a cyclical self-refresh sequence according to an exemplary embodiment of the present invention.

Turning to FIG. 5, a self-refresh sequence 300 for cycling the refresh function through subsets of WLs will be described. Again, this technique optimizes the amount of time that the WL driver circuits are kept at a reduced voltage to reduce the GIDL current. When a self-refresh entry command is issued, the row address counter 210 (FIG. 4) is reset to 0 in step 310. In step 320, the signal STDBY is set to $V_{PP}$ for all WL driver circuits in the array so that all bMWLs are discharged from $V_{PP}$ to $V_{DD}$. Next, in step 330, a first subset N (N=1) of 32 master WLs is selected and the control circuit 200 sets the signal STDBY to $V_{NWL}$ for the bMWL nodes of the WL driver circuits of the selected subset so that they are charged to $V_{PP}$. Next, in step 340, a period of time $t_{RET}/(\#WLs$ in the device) is given and then in step 350 WL M is the selected subsection N is refreshed. In step 360, a determination is made as to whether the WL M is less than the number of WL in the subsection and if so, the next WL address is selected (M=M+1) and steps 340 and 350 are repeated. The row address counter corresponds to the index M, which is incremented as shown after step 360. Thus, steps 340 and 350 are repeated to sequentially refresh each WL associated with the subsection of WL driver circuits that are charged to $V_{PP}$. Eventually, all 32 WLs in a subsection are refreshed and in step 370, the control circuit 200 returns the control signal STDBY to $V_{PP}$ so that the driver circuits for that subsection of master WLs discharge from $V_{PP}$ to $V_{DD}$. The process continues where the subsection index is incremented (N=N+1) and steps 330, 340, 350 and 360 are repeated for that subsection of WLs. The outer loop continues until all of the subsections of all of the blocks in the array are refreshed, and then the process may repeat.

When a particular WL address comes up that corresponds to a memory location that has failed and has been repaired by redundancy, it is possible the redundant location is in another memory block. There is a recognition of this during the sequence 300 so that when that WL address approaches, the control circuit can activate the WL driver circuitry in the appropriate one of the other blocks (FIG. 3) to charge a subset of WLs that includes the redundant WL to be sure the redundant WL is refreshed during the sequence 300.

Figure 6:
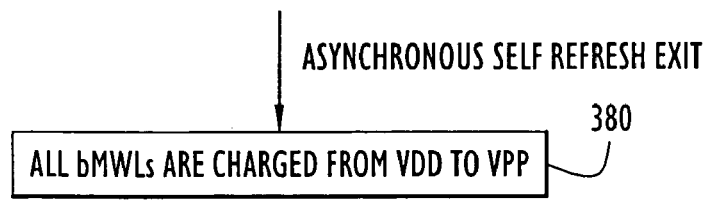
FIG. 6 is a flow chart showing exit from the self-refresh operation depicted in FIG. 5.

FIG. 6 illustrates what occurs when there is an asynchronous exit for the self-refresh sequence of FIG. 5. Essentially, in step 380, when an asynchronous self-refresh exit occurs, STDBY is set to $V_{NWL}$ for all WL driver circuits so that all bMWLs are charged from VDD to $V_{PP}$ by returning the signal STDBY to $V_{NWL}$. The self-refresh exit time depends on the size of the memory and the number of $V_{PP}$ pumps or additional $V_{PP}$ capacitances. For smaller density chips, the self-refresh exit time may be less than 70 ns and for larger density chips (greater than 512 Mb), the exit time may be as long as 200 ns.

Figure 7:
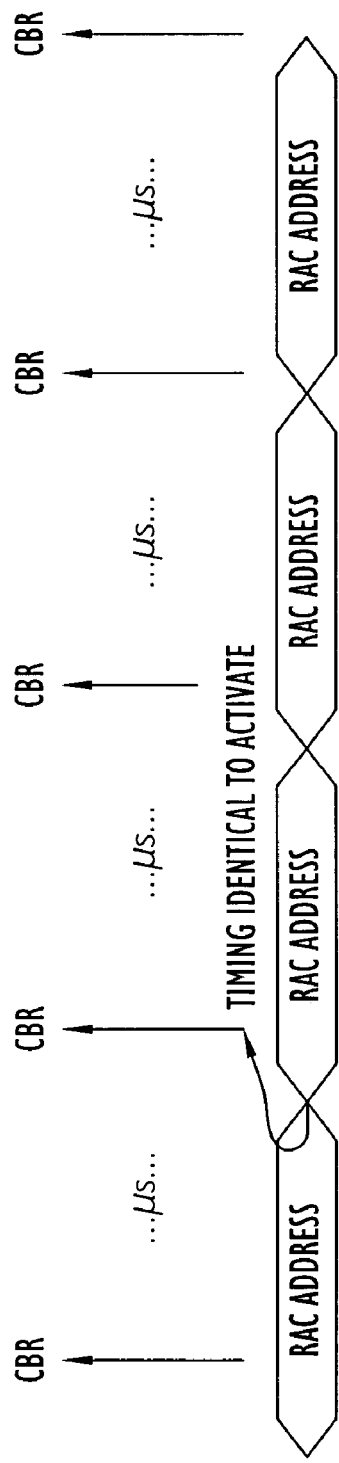
FIG. 7 is a timing diagram showing a prior art technique for a self-refresh operation.
Figure 8:
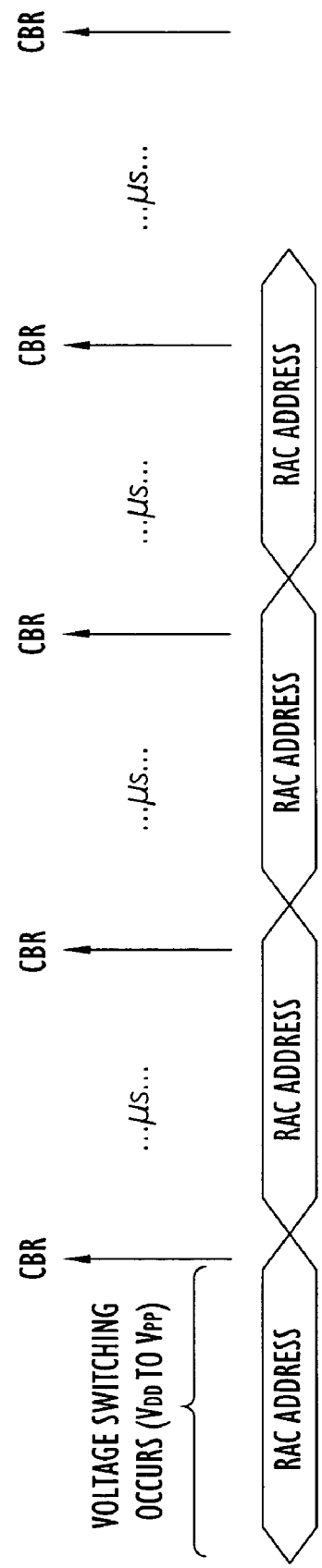
FIG. 8 is a timing diagram showing how wordline addresses are known in advance of a refresh operation according to an embodiment of the invention.

To allow for sufficient time for node charging and discharging of the driver circuitry and to account for potential inter-block redundancy, the timing critical operations can be moved to the time period between the actual refresh of 2 consecutive WLs (steps 340 and 350 in FIG. 5). With reference to FIG. 7, normally, all refresh activations are performed based on the same timing restrictions as during regular operation (address decoding, etc.), where CBR represents one WL refresh event. However, according to another aspect of the invention, the address is supplied before the WL refresh event (CBR) so that the next WL to be refreshed can be determined microseconds in advance of the actuation refresh function for that WL. Thus, the correct master WL block can be known in advanced and charged up to $V_{PP}$ during the time interval preceding that WL refresh event as depicted in FIG. 8. In addition, this allows for sufficient time to charge up additional subsections in the same or some other block of the memory in the event it is determined in advance of a refresh function for particular WL that the particular WL is replaced by a redundant WL corresponding to a different subset of WL driver circuits in the same or different memory block so that the different subset of WL driver circuits can be prepared for a refresh function of the redundant WL.

The system and methods described herein may be embodied in other specific forms without departing from the spirit or essential characteristics thereof. The foregoing embodiments are therefore to be considered in all respects illustrative and not meant to be limiting.

What is claimed is:

1. A method for reducing gate induced leakage current associated with circuits in a semiconductor memory integrated circuit device, comprising:
   a. during a standby mode of the device, reducing a voltage supplied to a transistor in a plurality of wordline driver circuits from a normal operating voltage level used for accessing memory cells to a lower voltage level so as to reduce gate induced leakage current associated with said plurality of wordline driver circuits while at said lower voltage level during said standby mode;
   b. during each of a plurality of time intervals while in said standby mode, increasing said voltage from the lower voltage level to the normal operating voltage level supplied to a subset of said plurality of wordline driver circuits and then reducing said voltage to the lower voltage level for said subset of wordline driver circuits; and
   c. determining in advance of a refresh function for memory cells associated with a particular wordline whether said particular wordline is replaced by a redundant wordline corresponding to a different subset of wordline driver circuits, and if so, increasing the voltage of said wordline driver circuits in said different subset from the lower voltage level to the normal operating voltage level to prepare for the refresh function of memory cells associated with said redundant wordline.

2. The method of claim 1, wherein (b) comprises increasing said voltage from the lower voltage level to the normal operating voltage level for a different subset of said plurality of wordline driver circuits during each of said plurality of time intervals.

3. The method of claim 1, and further comprising performing a refresh function of memory cells connected to each of a plurality of wordlines, one at a time, that are associated with said subset of said plurality of wordline driver circuits while said subset of plurality of wordline driver circuits are at the normal operating voltage level.

4. A method for reducing gate induced leakage current associated with wordline driver circuits in a memory integrated circuit device, comprising:
   a. during a standby mode of the device, switching a voltage supplied to a transistor in a plurality of wordline driver circuits from a first voltage to a second voltage which is less than said first voltage to reduce gate induced leakage current associated with said plurality of wordline driver circuits while at said second voltage;
   b. during a time interval while in said standby mode, increasing the voltage from the second voltage to the first voltage for a subset of said plurality of wordline driver circuits;
   c. determining in advance of a refresh function for memory cells associated with a particular wordline whether said particular wordline is replaced by a redundant wordline corresponding to a different subset of wordline driver circuits, and if so, increasing the voltage of said wordline driver circuits in said different subset from the second voltage to the first voltage to prepare for the refresh function of memory cells associated with said redundant wordline;
   d. sequentially performing a refresh function of memory cells connected to wordlines associated with said subset of said plurality of wordline driver circuits that are at the first voltage; and
   e. upon completion of said refresh function for all of the wordlines associated with said subset of said plurality of wordline driver circuits, reducing the voltage of said subset of said plurality of wordline driver circuits from the first voltage to the second voltage.

5. The method of claim 4, and further comprising repeating (b)-(d) during each of a plurality of time intervals for different subsets of said plurality of wordline driver circuits.

6. A memory device, comprising:
   a. a plurality of wordline driver circuits associated with wordlines of a memory array, each of the wordline driver circuits comprising at least one transistor;
   b. a plurality switching circuits associated with said plurality of wordline driver circuits, wherein each switching circuit switches the voltage supplied to the transistor of the one or more wordline driver circuits between a first level and a second level that is less than said first level; and
   c. a control circuit coupled to said plurality of switching circuits, wherein during a standby mode of said semiconductor integrated circuit memory device the control circuit supplies a control signal to the plurality of switching circuits to switch the voltage to said second level for said plurality of wordline driver circuits so as to reduce gate induced leakage current associated with said plurality of wordline driver circuits while at said second level, and said control circuit supplies said control to the switching circuits associated with a subset of said plurality of wordline driver circuits to increase said voltage from the second level to the first level and then controls the switching circuits to switch from the first level to the second level, and wherein the control circuit determines in advance of a refresh function for memory cells associated with a particular wordline whether said particular wordline is replaced by a redundant wordline corresponding to a different subset of wordline driver circuits, and if so, increases the voltage of said wordline driver circuits in said different subset from the second level to the first level to prepare for the refresh function of memory cells associated with said redundant wordline.

7. The device of claim 6, wherein said control circuit is coupled to a row address counter and generates said control signal to increase said voltage from the second level to the first level for a different subset of said plurality wordline driver circuits during each of a plurality of time intervals during said standby mode.

8. A memory device, comprising:
a. a plurality of means for driving wordlines of a memory array, each of the means for driving comprising at least one transistor;
b. means for switching a voltage supplied to said transistor of said plurality of means for driving between a first voltage and a second voltage which is less than the first voltage; and
c. control means coupled to said means for switching, wherein during a standby mode, said control means controls said means for switching to switch to said second voltage used by said plurality of means for driving so as to reduce gate induced leakage current otherwise produced by said plurality of means for driving while at said second voltage, and controls said means for switching to switch to the first voltage for a subset of said plurality of means for driving and then switches to said second voltage upon completion of a refresh operation, and wherein the control circuit determines in advance of the refresh function for memory cells associated with a particular wordline whether said particular wordline is replaced by a redundant wordline corresponding to a different subset of wordline driver circuits, and if so, increases the voltage of said wordline driver circuits in said different subset from the second level to the first level to prepare for the refresh function of memory cells associated with said redundant wordline.

9. The device of claim 8, wherein said control means controls said means for switching so that said voltage is switched from the second voltage to the first voltage for a different subset of said plurality of wordline driver circuits during each of a plurality of time intervals during said standby mode.

10. The device of claim 8, wherein when reducing said voltage, said control means controls at least one transistor in the plurality of wordline driver circuits to discharge from the first voltage to said second voltage.

11. The device of claim 6, wherein said control circuit generates said control signal to the switching circuits associated with said subset of said plurality of wordline driver circuits to increase said voltage from the second level to the first level to allow for a refresh function to be sequentially performed on memory cells connected to wordlines associated with said subset of wordline driver circuits.

12. The device of claim 8, wherein said control means generates said control signal to the means for switching associated with said subset of said plurality of means for driving to increase said voltage from the second voltage to the first voltage to allow for a refresh function to be sequentially performed on memory cells connected to wordlines associated with said subset of plurality of means for driving.

* * * * *